US006515305B2

(12) United States Patent
Gopinath

(10) Patent No.: US 6,515,305 B2
(45) Date of Patent: Feb. 4, 2003

(54) VERTICAL CAVITY SURFACE EMITTING LASER WITH SINGLE MODE CONFINEMENT

(75) Inventor: Anand Gopinath, Wayzata, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 09/954,510

(22) Filed: Sep. 17, 2001

(65) Prior Publication Data

US 2002/0079497 A1 Jun. 27, 2002

Related U.S. Application Data

(60) Provisional application No. 60/233,385, filed on Sep. 18, 2000.

(51) Int. Cl.$^7$ ............................ H01L 27/15; H01S 3/082
(52) U.S. Cl. .............................. 257/79; 257/80; 372/92; 372/97
(58) Field of Search ....................... 372/97, 92; 257/79, 257/80

(56) References Cited

U.S. PATENT DOCUMENTS

| | | | |
|---|---|---|---|
| 5,086,430 A | 2/1992 | Kapon et al. ................. 372/50 |
| 5,245,622 A | 9/1993 | Jewell et al. ................. 372/45 |
| 5,295,147 A | 3/1994 | Jewell et al. ................. 372/45 |
| 5,317,587 A | 5/1994 | Ackley et al. ................ 372/45 |
| 5,343,487 A | 8/1994 | Scott et al. .................. 372/46 |
| 5,345,462 A | 9/1994 | Choquette .................... 372/45 |
| 5,351,257 A | 9/1994 | Lebby et al. ................. 372/46 |
| 5,359,447 A | 10/1994 | Hahn et al. .................. 359/154 |
| 5,387,543 A | 2/1995 | Ackley ........................ 437/129 |
| 5,426,657 A * | 6/1995 | Vakhshoori .................. 372/101 |
| 5,446,732 A | 8/1995 | Miyamoto .................... 370/58.2 |
| 5,446,752 A * | 8/1995 | Ackley et al. ................ 372/45 |
| 5,446,753 A | 8/1995 | Yoshida ....................... 372/46 |
| 5,461,637 A | 10/1995 | Mooradian et al. .......... 372/92 |
| 5,553,185 A * | 9/1996 | Antos et al. ................. 385/124 |
| 5,559,053 A | 9/1996 | Choquette et al. .......... 437/129 |
| 5,574,738 A | 11/1996 | Morgan ....................... 372/28 |
| 5,594,751 A | 1/1997 | Scott ........................... 372/46 |

(List continued on next page.)

OTHER PUBLICATIONS

"Vertical–Cavity Surface–Emitting Lasers with Ion–Implanted Current Apertures and Index Guiding", by L.F. Chirovsky et al., *Conference on Lasers and Electro Optics*, May 7–12, 1998.
"InGaAs/GaAs Vertical Cavity Surface Emitting Lasers", by G. Hill et al., 2 pgs. (Nov. 12, 1995).
"Transverse Mode Control of Vertical Cavity Top–Surface–Emitting Lasers", by R.A. Morgan et al., *IEEE Photonics Technology Letters*, vol. 4, No. 4, pp. 374–377, (Apr. 1993).
"Singlemode Emission from a Passive–Antiguide–Region Vertical–Cavity Surface–Emitting Laser", by Y.A. Wu et al., *Electronics Letters*, vol. 29, No. 21, pp. 1861–1863, (Oct. 14, 1993).
"Single–Mode Vertical Cavity Surface Emitting Laser by Graded–Index Lens Spatial Filtering", by B. Koch et al., *Appl. Phys. Lett.*, vol. 70, No. 18, pp. 2359–2361, (May 5, 1997).
"Optical Electronics in Modern Communications", by A. Yariv, *Oxford University Press*, pp. 76–89, (1997).

Primary Examiner—David Nelms
Assistant Examiner—Tu-Tu Ho
(74) Attorney, Agent, or Firm—Westman, Champlin & Kelly, P.A.

(57) ABSTRACT

A vertical cavity surface emitting laser, includes a substrate, a lower mirror stacked adjacent the substrate, an active region operably coupled to the lower mirror stack, and an upper mirror operably coupled to the active region, opposite the lower mirror. The lower mirror, active region, and upper mirror are arranged in a vertical stack to form a laser. A plurality of spaced apart regions of increased refractive index which extend in a vertical direction at least partially through the vertical stack to promote single mode confinement in the stack.

24 Claims, 3 Drawing Sheets

U.S. PATENT DOCUMENTS

| | | | |
|---|---|---|---|
| 5,604,628 A | 2/1997 | Parker et al. | 359/344 |
| 5,619,318 A | 4/1997 | Yamamoto et al. | 356/32 |
| 5,745,515 A | 4/1998 | Marta et al. | 372/45 |
| 5,753,941 A | 5/1998 | Shin et al. | 257/98 |
| 5,754,578 A | 5/1998 | Jayaraman | 372/50 |
| 5,757,837 A | 5/1998 | Lim et al. | 372/50 |
| 5,764,674 A | 6/1998 | Hibbs-Brenner et al. | 372/46 |
| 5,773,319 A | 6/1998 | Chu et al. | 438/39 |
| 5,774,487 A | 6/1998 | Morgan | 372/45 |
| 5,778,018 A | 7/1998 | Yoshikawa et al. | 372/45 |
| 5,828,688 A | 10/1998 | Cook et al. | 372/96 |
| 5,831,960 A | 11/1998 | Jiang et al. | 369/121 |
| 5,838,715 A * | 11/1998 | Corzine et al. | 144/134.1 |
| 5,859,866 A | 1/1999 | Forrest et al. | 372/50 |
| 5,874,730 A | 2/1999 | Yi et al. | 250/214 |
| 5,879,961 A | 3/1999 | Scott | 438/32 |
| 5,886,972 A | 3/1999 | Jiang et al. | 369/116 |
| 5,893,722 A | 4/1999 | Hibbs-Brenner et al. | 438/45 |
| 5,903,585 A * | 5/1999 | Dawson et al. | 372/44 |
| 5,915,165 A * | 6/1999 | Sun et al. | 372/45 |
| 5,917,848 A | 6/1999 | Claisse et al. | 372/96 |
| 5,960,024 A | 9/1999 | Li et al. | 372/96 |
| 6,055,262 A * | 4/2000 | Cox et al. | 372/45 |
| 6,243,407 B1 * | 6/2001 | Mooradian | 372/82 |
| 6,298,076 B1 * | 10/2001 | Caprara et al. | 372/22 |

* cited by examiner

VERTICAL CAVITY SURFACE EMITTING LASER WITH SINGLE MODE CONFINEMENT

The present application is based on and claims the benefit of U.S. provisional patent application Ser. No. 60/233,385, filed Sept. 18, 2000, the content of which is hereby incorporated by reference in its entirety.

BACKGROUND OF THE INVENTION

The present invention relates to semiconductor vertical cavity surface emitting lasers (VCSELs). More particularly, the present invention relates to VCSELs which provide high efficiency single-mode operation.

A VCSEL is a laser produced using semiconductors in which an optically active material is positioned between two reflective layers. Typically, the optically active material can comprise materials such as gallium arsenide, indium gallium arsenide, or quaternaries such as aluminum indium gallium arsenide, indium gallium arsenide phosphide, or indium gallium arsenide nitride. The reflective layers are typically of a multilayered dielectric material or metallic material. These layered mirrors are referred to as Bragg stacks. One of the mirrors is partially reflective as is typical of lasers such that coherent light built up in the resonating cavity between the two mirrors can pass out of the device.

Lasers have found many applications in modern technologies. In general, lasers are structures which require optical confinement of photons which are stimulated by pumping electrons into the device. Carrier confinement can be achieved by varying the resistivity of the materials between the electrical contacts and the active regions. Optical confinement is provided by employing materials having different refractive indexes which act as mirrors.

The Vertical Cavity Surface Emitting Laser (VCSEL) is currently a well established device for a variety of applications. The emission from this laser is normal to the plane of the device, and therefore, the device may be processed using standard semiconductor processing techniques, without the cleaving process required of edge-emitting devices. This manufacturing advantage is significant, since the devices can be tested before expensive packaging is performed. The beam profile is also symmetric (permitting more efficient coupling to fibers) and consists of a single longitudinal mode. These advantages make VCSEL devices less expensive to fabricate, reduce the complexity of the associated optics, and increase the performance and robustness of the entire system. For this reason, it is expected that VCSELs will be the laser of choice for an increasing number of electro-optic systems in the near future.

The structure of a VCSEL is comprised of an active region consisting of one or several quantum wells with appropriate barriers between the wells, spacer layers, and high reflectivity mirrors on either side of the active region. The mirrors consist of epitaxially deposited semiconductor material with an alternating low and high index, forming a highly reflective Bragg stack. The wavelength of emission of the laser is determined by the gain-bandwidth of the quantum wells and the cavity formed by the active region and the mirrors. There is a significant drawback to current VCSEL performance, however. Due to the small gain length, VCSEL power levels typically are small. In the current form of the VCSEL, the exciting electrical current passes through the Bragg stacks. However, since the alternating high and low index modulation is obtained with material of different bandgaps, heterojunctions result which increase the electrical resistance of the stack. Several techniques including grading of the composition, and varying the doping levels are used to reduce this resistance. A more recent innovation is to place an aperture of alumina ($Al_2O_3$), with a central region of either $Al_xGa_{1-x}As$ (with the mole fraction $\chi$ being larger than 0.65) just above the active region so that the current funnels through this aperture center. This has resulted in VCSELs with lasing threshold currents of less than 1 mA.

A number of techniques have been used for forcing the devices to operate in single mode; these include spatial filtering (see R.A. Morgan et al., "Transverse Mode Control of Vertical-Cavity Top-Surface-Emitting Lasers", *IEEE Photon. Tech. Lett.*, Vol. 4, pp. 374–376, 1993), antiguiding techniques (see, Y. A. Wu et al., "Single-Mode Emission from a Passive Antiguiding Region Vertical Cavity Surface Omitting Laser", *Electronics Lett.*, pp. 1861–1863, 1993), and external cavity techniques (see, B. Koch et al., "Single-Mode Vertical Cavity Surface Emitting Laser by Graded Index Lens Spatial Filtering", *Apl. Phys. Lett.Appl. Phys. Lett.*, Vol. 70, pp. 2359–2361, 1997), and altering the top mirror structure (see, H. Martinson et al., "Transverse Mode Selection in Large Area Oxide Confined Vertical Cavity Surface Emitting Lasers Using Shallow Surface Relief", *IEEE Photon. Tech. Lett.*, Vol. 11, pp. 1536–1538, 1999 and B. Koch et al., "Single Mode VCSEL", *Digest of the Conference on Lasers and Electro-Optics (CLEO* 2000, San Francisco, Calif., pp. May 1, 2000). These techniques have resulted in VCSEL power output being limited to less than 5 mW.

One drawback with many existing VCSEL designs is their performance. VCSEL power levels for single mode devices are typically very small and increasing the device size results in multi-mode behavior with a significant increase in power.

Attempts to increase the power output of a VCSEL by increasing the diameter of the VCSEL have led to undesirable consequences. Currently, when the VCSEL diameter for the conventional structure is greater than about 7 $\mu$m diameter, or in the oxide VCSELs, when the oxide central aperture diameter exceeds about 2.5 $\mu$m diameter, the devices oscillate in several different transverse modes, and this results in the emission of light with as many wavelengths as there are modes. There are two major reasons for requiring single transverse mode operation. The first is that light from a multiple-transverse mode source cannot be focussed efficiently, so that coupling to devices such as single-mode fiber amplifiers is inefficient. The second reason is that the multiple wavelengths corresponding to the various transverse modes significantly compromise the operation of wavelength-sensitive systems such as single-mode optical fiber communication.

SUMMARY OF THE INVENTION

A vertical cavity surface emitting laser, includes a substrate, a lower mirror stacked adjacent the substrate, an active region operably coupled to the lower mirror stack, and an upper mirror operably coupled to the active region, opposite the lower mirror. The lower mirror, active region and upper mirror are arranged in a vertical stack to form a laser. A plurality of spaced apart regions of increased refractive index extend in a vertical direction at least partially through the vertical stack to promote single mode confinement in the stack. Other aspects include an etalon structure for tuning, an increase index of refraction region which is not circular in cross section, and a plurality of concentric rings around the core.

DETAILED DESCRIPTION OF THE PREFERRED EMBODIMENTS

In various aspects, the present invention is related to U.S. patent application Ser. No. 09/378,792, filed Aug. 23, 1999 (which is incorporated herein by reference in its entirety) which describes an implantation and etching techniques which enhance the single mode operation of the VCSEL, a technique for ensuring that the polarization of the emission of the VCSEL is fixed is outlined, and finally a mechanism for tuning the wavelength of VCSELs is also suggested. The present invention is applicable to VCSELs that operate at the short wavelengths of 840 nm and lower, 980 nm, and for the 1300 nm and the 1500 nm bands. However, any appropriate wavelength can be used.

The present invention includes three aspects. First, a technique is provided for mode confinement in the mirror region of the laser by etching or implantation to obtain a photonic band gap VCSEL structure, to ensure single mode behavior. Second, a modification of the implantation and etching technique is provided to ensure that emission of the VCSEL has a fixed polarization, which will be effective in both single mode and multimode VCSELs. Third, a modification to the VCSEL structure to allow the wavelength of emission of the single mode VCSEL to be tuned.

The present invention includes the recognition that aspects of the "holey fiber" concept (see T. A. Birks et al., "Full 2-D Photonic Bandgaps in Silicon/Air Structure", *Electronics Letters*, Vol. 31, pp. 1941–1943, 1995; J. C. Knight, et al., "All Silica Single-Mode Optical Fiber With Photonic Crystal Cladding", *Opt. Lett.*, Vol. 21, pp. 1547–1549, 1996; J. C. Knight et al., "Photonic Band Gap Guidance In Optical Fibers", *Science*, Vol. 282, pp. 1476–1478, 1998; and P. J. Bennet et al., "Toward Practical Holey Fiber Technology: Fabrication, Splicing, Modeling, and Characterization", *Opt. Lett.*, pp. 1203–1205, 1999) used in optical silica fibers are applicable to VCSELs. In holey fibers, periodically placed air holes along the length of silica fibers have two effects, the first effect results in a reduction of the effective index of refraction of the region with holes due to the composite nature of the structure. The second effect which is due to the periodicity of the holes determines the pass-bands and stop-bands for the wavelengths that can and cannot propagate through the structure, also termed the photonic band gap (PBG) effect. The former effect has lead to design guidelines for the structure in the "Endless single-mode photonic crystal fiber" (T. A. Birks et al., "Endlessly Single Mode Singe-Mode Photonic Crystal Fiber", *Opt. Lett.*, Vol. 22, pp. 961, 1997), and thus leads to a central "core" region with a higher index, surrounded by the holey lower index region. By careful design, this is equivalent to a single mode fiber with a lower V number, with V<2.405.

Figure 1:
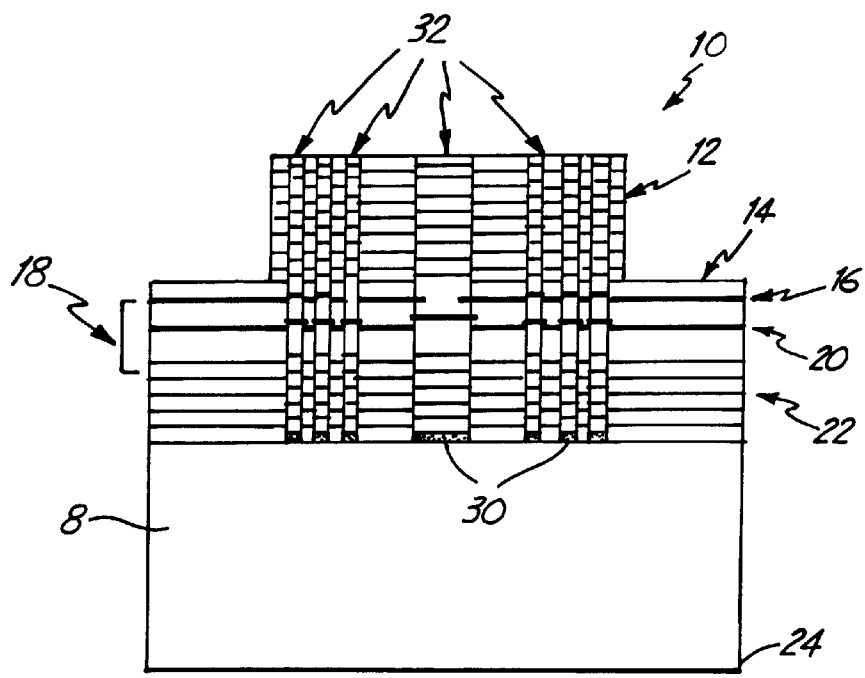
FIG. 1 is a side cross-sectional view of a VCSEL in accordance with one embodiment of the present invention.

FIG. 1 is a side cross-sectional view of a VCSEL 10 in accordance with one example embodiment of the present invention deposited on substrate 8. VCSEL 10 includes an upper mirror stack 12, an upper contact 14, an oxide aperture 16, an active region 18 including quantum wells 20, a lower mirror stack 22 arranged vertically, and a lower contact 24. Note that the present invention is applicable to any VCSEL configuration and is not limited to the specific configurations set forth herein.

A plurality of etched pillars 30 extend vertically through the VCSEL to provide regions of 32 having greater indices of refraction than the surrounding material. In various embodiments, the pillars 30 comprise air holes or other material or comprise material which has been implanted to change its characteristics, or which is offset due to etching of the substrate.

Figure 2:
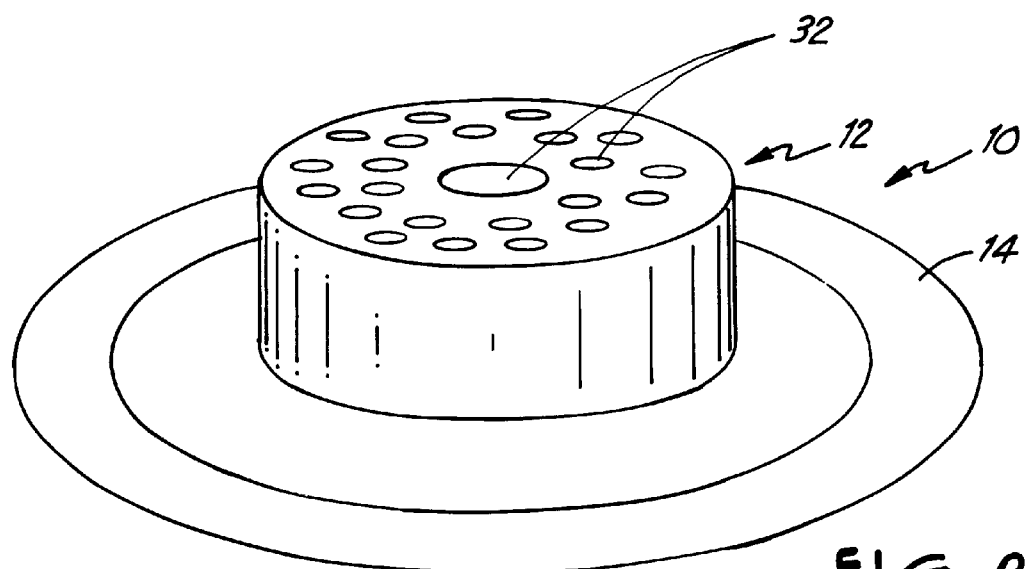
FIG. 2 is a top perspective view of the VCSEL of FIG. 1.

FIG. 2 is a side perspective view of VCSEL 10 and illustrates the spacing of regions 32. Note that regions 32 are shown including a central core with regions spaced about the core.

With the invention, the top mirror 12 (or preferably the top and bottom mirrors) of the VCSEL 10 is modified with periodically placed air holes or etched pillars 30 which ensures single mode behavior. These air holes need to be submicron in diameter, and their spacing is also submicron for all wavelengths of interest ranging from 840 nm to 1550 nm. The typical top mirror stack 12 of a 980 nm VCSEL 10 is approximately 3 $\mu$m thick, and etching submicron holes in such a thick structure while maintaining the cross-section may be problematic. One alternative is to use ion implantation of protons or other species into the top doped mirror, to remove the carriers, and thus increase the index by a very small value. Since the change in index is very small, the spacing and diameter of the pillars 32 with increased index can be in the quarter micron to one micron range, and within the capabilities of traditional optical lithography. A third technique is to etch pillars or depressions in the substrate before growth. These pillars or depression locally increase (through implantation, for example) or decrease (through depressions etched in the substrate, for example) the index through the entire structure, and thus with proper choice of the size and spacing, also in the submicron range, single mode behavior of the VCSEL 10 is ensured.

In U.S. patent application Ser. No. 09/378,792, filed Aug. 23, 1999, means of obtaining single mode output from a VCSEL is suggested. In that disclosure, one technique suggested to perform ion implantation in one or both mirrors to provide an increased index in a central region, which becomes a waveguide with the characteristic V number less than 2.405. Note that the V number is defined as:

$$V=(2\pi/\lambda_0)a(n_1^2-n_2^2)^{0.5} \qquad \text{EQ. 1}$$

where $n_1$ and $n_2$ are the indices of the index enhanced region, and that of the remaining region, a is the radius or equivalent radius of the enhanced region, and $\lambda_0$ is the free space wavelength of the laser being considered. A second technique is to use etched pillars in the substrate before growth to perform this same function, to increase the index of the central region of the mirrors, and in all cases with the V number is less than 2.405. Such a structure is illustrated in FIG. 2, which is numbered in a manner consistent with FIG. 1.

Figure 3:
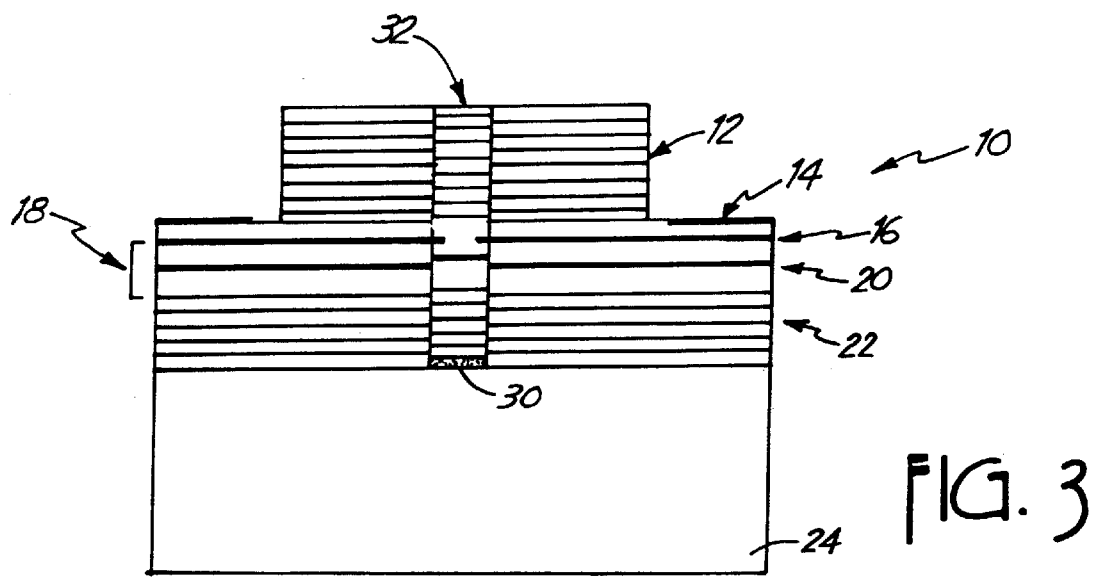
FIG. 3 is a side cross-sectional view of a VCSEL in accordance with another aspect of the invention.
Figure 4:
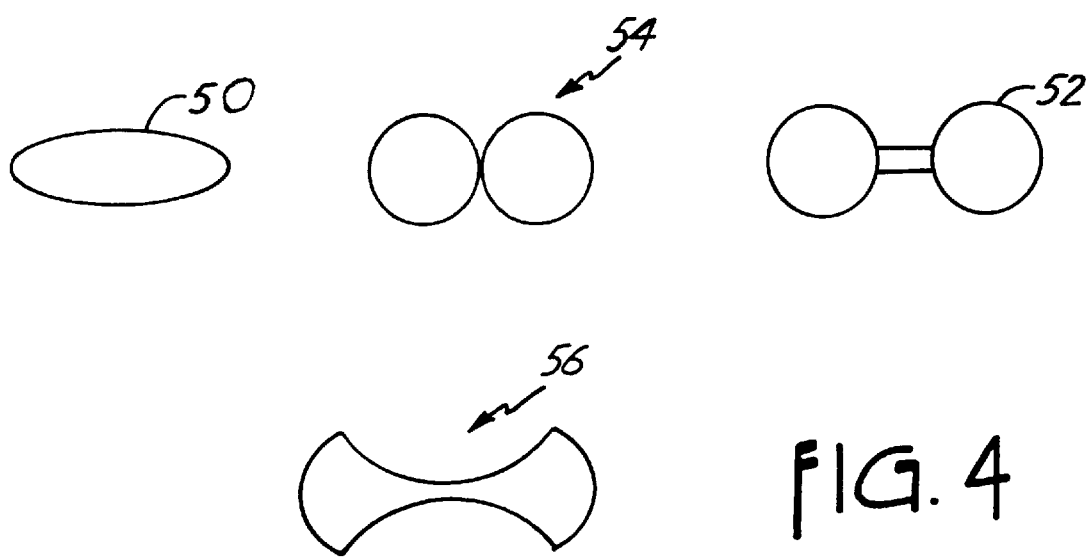
FIG. 4 shows top plan views of shapes for a region of increased refractive index of the invention.

To obtain a fixed polarization of the emission from the VCSEL 10, the cross section of the control region 32 can be elliptic 50 (see FIG. 3), dumbbell shaped 52, adjacent-circles shaped 54 or a bow-tie pillar or implantation region 56. For example, FIG. 4 illustrates D or other shapes, not identically symmetric about both axes can be used for implantations, or pillars or depressions, and then the preferred emission polarization is along the major axis of the ellipse or the dumbbell or bow-tie or D region. Note that these techniques are used to obtain polarization-maintaining fiber. The preferred polarization of the electrical field in these structures is along the major axis of the noncircular increased index region, and the present invention recognizes the application of this technique to VCSEL to obtain emission with fixed polarization.

Figure 5:
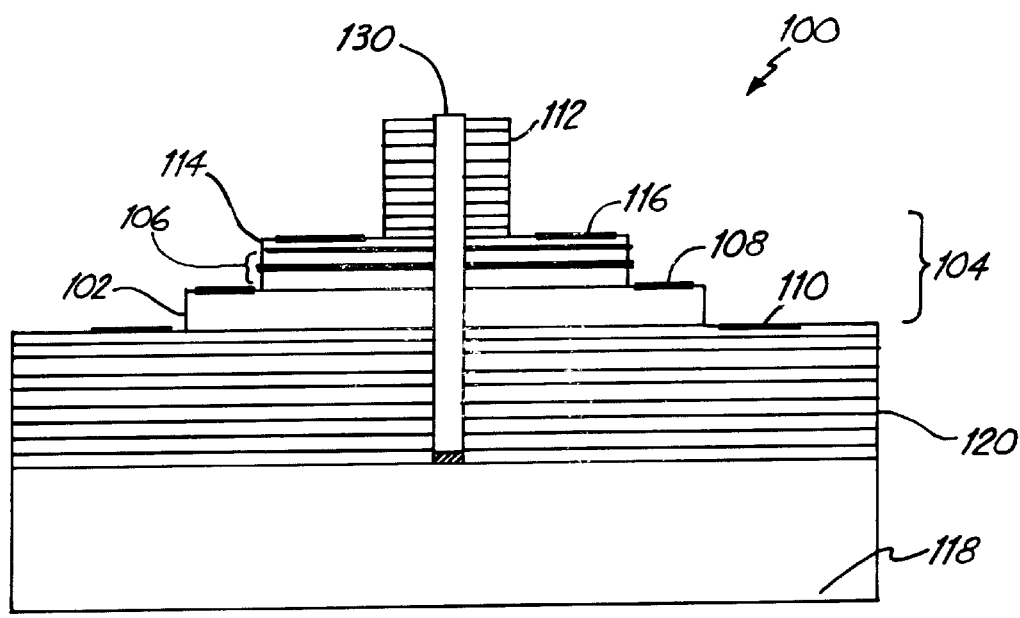
FIG. 5 shows a VCSEL including an etalon structure in accordance with another aspect of the invention.

A method is provided for wavelength tuning of the VCSEL in which a variable index passive Fabry-Porot etalon structure coupled to the active cavity region, so that the coupled structure may be tuned. A side cross-sectional view of VCSEL 100 is shown in FIG. 5 where the etalon structure 102 becomes part of the main active cavity 104 which includes quantum wells 106, lower cavity/upper etalon contact 108 and lower etalon contact 110. The active region 104 is spaced apart from upper mirror 112 by oxide aperture 114 and upper cavity contact 116. On the opposite side, active region 104 is spaced apart from lower contact 118 by lower mirror 120 and a region 130 of higher index of refraction material extends vertically through the VCSEL 100.

A doped etalon structure with $p^+$ and $n^+$ contacts on either side of the etalon allows application of a reverse bias, which increases the index slightly because of depletion of the carriers, and thus tunes the length of the cavity. The Pockels effect which is the linear electro-optic effect with an undoped etalon also tunes the cavity, but this change is also small. The largest reverse bias index change occurs with quantum wells close to their band edge. An etalon structure with quantum wells which are narrow, to be nonabsorbing at all the emission wavelengths, can also be used to tune the VCSEL emission wavelength. However, this effect remains small, on the order of a few nanometers at most.

Forward bias of the etalon causes current to be injected into the structure, without quantum wells, and this current will decrease the index by nearly 0.03. The combined effect of this tuning of the etalon index results in wavelength variation of about 5 nm in the short wavelength VCSELs (~980 nm) with λ two etalon, and possibly somewhat less for longer wavelength devices. Longer etalons provide a greater tuning range which can go as high as 10 nm, or more, but the free spectral range of the cavity and etalon cause more than one longitudinal mode to be excited and the mode suppression ratio to become an issue. The problem of the current injection tuning of the etalon is that this generates additional heat, and the cavity losses also increase due to free carrier absorption. The tuning etalon can be positioned anywhere in the mirror stacks, however, just below the main cavity is preferred. The most significant effect is likely to take place when this is placed adjacent to the main active region cavity. Single mode and multimode device wavelengths can be tuned with this technique. While there has been work on the use of the etalon to retain single mode behavior (see, G. Chen et al., "Angular Filtering of Spatial Modes in a Vertical Cavity Surface Emitting Laser by a Fabry-Perot Etalon", *Appl. Phys. Letters*, vol. 74, pp. 1069–1071, 1999), it has not been used to perform the tuning of the VCSEL.

Figure 6:
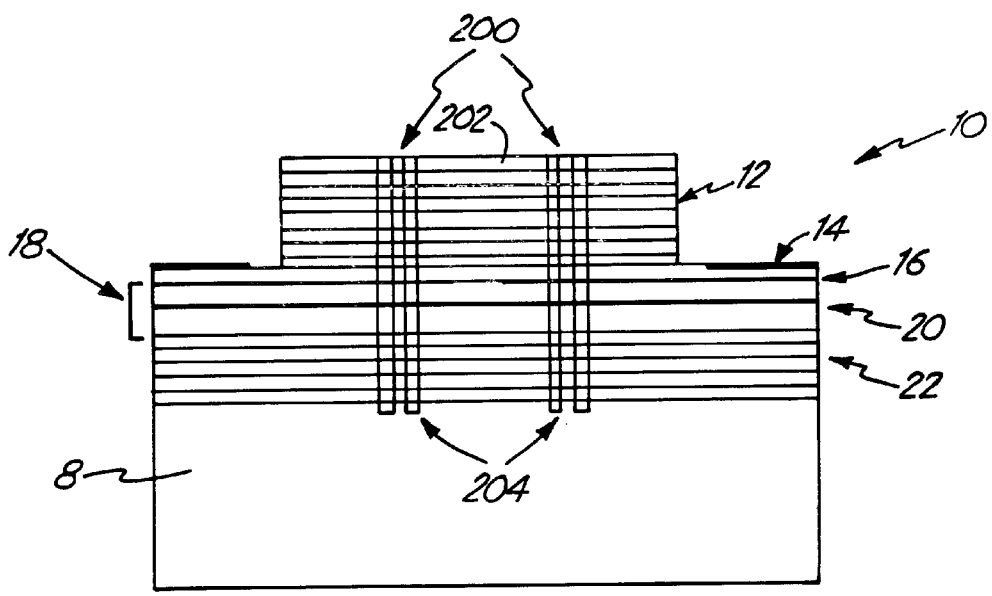
FIG. 6 is a view similar to FIG. 1 showing another embodiment of a VCSEL which includes rings having lower indices of refraction.

FIG. 6 shows another example embodiment of VCSEL 10 in which rings 200 of lower index of refraction are arranged around a core region 202. To obtain single mode behavior, one alternative to placing low index columns around the core, is to use a radial Bragg stack, rings of high and low indices, also surrounding the core. A high reflectivity full radial Bragg stack would appear as either a short circuit, which implies that the electric field becomes zero, or an open circuit, when the field becomes a maximum at the boundary between the core and the radial stack. It can be shown that in this case, the cutoff frequency for this structure is $(0.293\,c)/(a\,\eta_{core})$, where c is the velocity of light, a is the radius of the core, and $\eta_{core}$ is the index of the core. No frequencies below this value can propagate, and the corresponding cutoff free space wavelength is 3.41 a $\eta_{core}$, and light of wavelengths shorter than this may propagate. The corresponding cutoff wavelength of the second mode is 2.61 a $\eta_{core}$. Thus, by designing the first mode of the VCSEL to operate within these two wavelengths, the device may be made single mode. For semiconductor material with an average index of 3.4, the value of a becomes too small to be practical. Thus, the alternative is to use an incomplete radial Bragg stack. In this case, the core radius, is chosen depending on the power handling capability and other criteria, and then the rings of low and high index rings are used to create a composite low index cladding region, with V number less than 2.4. This may be accomplished by implantation of the top mirror of the core, and the high index rings of the Bragg stack, noting that the implantation results in a slightly higher index. Ideally this needs to be implemented through the whole VCSEL structure, not just in the top mirror, and if implemented in the active cavity, the mode of the cavity also experiences radial confinement, which implies better mode confinement. A second alternative is to etch ring depressions or protuberance 204 to reduce or increase the index, and etch a pillar for the core to increase the index slightly in the substrate before growth of the epitaxial layers, again ensuring that the V number remained less than 2.4.

Although the present invention has been described with reference to preferred embodiments, workers skilled in the art will recognize that changes may be made in form and detail without departing from the spirit and scope of the invention.

What is claimed is:

1. A vertical cavity surface emitting laser, comprising:

a substrate;

a lower mirror stacked adjacent the substrate;

an active region operably coupled to the lower mirror stack;

an upper mirror operably coupled to the active region, opposite the lower mirror; the lower mirror, active region, and upper mirror arranged in a vertical stack to form a laser; and a plurality of horizontally spaced apart regions of increased refractive index which extend in a vertical direction through a plurality of layers of the vertical stack to promote single mode confinement in the stack.

2. The apparatus of claim 1 wherein the regions of increased refractive index extend through the lower mirror, active region and upper mirror.

3. The apparatus of claim 1 wherein the regions of increased refractive index comprise elongate pillars.

4. The apparatus of claim 1 where the regions of increased refractive index comprise air holes.

5. The apparatus of claim 1 wherein the regions of increased refractive index comprise ion implanted regions.

6. The apparatus of claim 5 wherein the ion implanted regions comprise regions of reduced carriers in the top mirror.

7. The apparatus of claim 1 wherein the substrate is etched to thereby form the regions of increased refractive index.

8. The apparatus of claim 1 wherein the regions of increased refractive index are spaced around a core which extends vertically through the layers.

9. The apparatus of claim 8 wherein the core region has a non-circular horizontal cross section to fix a polarization of the laser.

10. The apparatus of claim 1 wherein a V number for the laser is less than 2.405.

11. The apparatus of claim 1 including an etalon structure to tune the laser.

12. The apparatus of claim 1 including a plurality of rings which extend in a vertical direction through a plurality of layers of the vertical stack to promote single mode confinement in the stack.

13. A vertical cavity surface emitting laser, comprising:
a substrate;
a lower mirror stacked adjacent the substrate;
an active region operably coupled to the lower mirror stack;
an upper mirror operably coupled to the active region, opposite the lower mirror; the lower mirror, active region, and upper mirror arranged in a vertical stack to form a laser; and
an increased index of refraction region in at least one of the upper and lower mirrors extending in a direction perpendicular to the active region having a cross-section which is non-circular which provides an axis of non-symmetry in a horizontal plane to thereby fix a polarization of the laser.

14. The apparatus of claim 13 including a plurality of horizontally spaced apart regions of increased refractive index which extend in a vertical direction through a plurality of layers of the vertical stack to promote single mode confinement in the stack.

15. The apparatus of claim 13 including an etalon structure configured to tune the laser formed by the upper mirror, lower mirror and active region.

16. The apparatus of claim 13 wherein a V number for the laser is less than 2.405.

17. A vertical cavity surface emitting laser, comprising:
a substrate;
a lower mirror stacked adjacent the substrate;
an active region operably coupled to the lower mirror stack;
an upper mirror operably coupled to the active region, opposite the lower mirror; the lower mirror, active region, and upper mirror arranged in a vertical stack to form a laser; and
a plurality of rings which extend in a vertical direction through a plurality of layers of the vertical stack to promote single mode confinement in the stack.

18. The apparatus of claim 17 including an etalon structure configured to tune the laser formed by the upper mirror, lower mirror and active region.

19. The apparatus of claim 17 including an increased index of refraction region in at least one of the upper and lower mirrors extending in a direction perpendicular to the active region having a cross-section which is non-circular which provides an axis of non-symmetry in a horizontal plane to thereby fix a polarization of the laser.

20. The apparatus of claim 17 wherein the rings provide regions of increased refractive index.

21. The apparatus of claim 20 wherein the substrate is etched to thereby form the rings.

22. The apparatus of claim 17 wherein the rings extend around a core which extends vertically through the layers.

23. The apparatus of claim wherein 22 the core region has a non-circular horizontal cross section to fix a polarization of the laser.

24. The apparatus of claim 17 wherein a V number for the laser is less than 2.405.

* * * * *

UNITED STATES PATENT AND TRADEMARK OFFICE
CERTIFICATE OF CORRECTION

PATENT NO.   : 6,515,305 B2
DATED        : February 4, 2003
INVENTOR(S)  : Gopinath It is certified that error appears in the above-identified patent and that said Letters Patent is hereby corrected as shown below:

<u>Column 8,</u>
Line 32, change "wherein 22" to -- 22 wherein --.

Signed and Sealed this

Eleventh Day of November, 2003

JAMES E. ROGAN
*Director of the United States Patent and Trademark Office*